United States Patent

Kawata

Patent Number: 6,124,718
Date of Patent: Sep. 26, 2000

[54] CHARGED-PARTICLE-BEAM PROJECTION-EXPOSURE APPARATUS WITH INTEGRATED RETICLE AND SUBSTRATE INSPECTION

[75] Inventor: Shintaro Kawata, Ibaraki-ken, Japan

[73] Assignee: Nikon Corporation, Tokyo, Japan

[21] Appl. No.: 08/941,529

[22] Filed: Sep. 30, 1997

[30] Foreign Application Priority Data

Oct. 11, 1996 [JP] Japan ................................ 8-269765

[51] Int. Cl.⁷ ........................... G03B 27/58; G03B 27/42
[52] U.S. Cl. .............................................. 324/750; 355/53
[58] Field of Search ........................... 324/750; 250/310, 250/306; 355/43, 72, 53; 356/401

[56] References Cited

U.S. PATENT DOCUMENTS

| | | | |
|---|---|---|---|
| 4,699,515 | 10/1987 | Tanimoto et al. | 356/401 |
| 4,814,829 | 3/1989 | Kosugi et al. | 355/43 |
| 4,834,540 | 5/1989 | Totsuka et al. | 356/401 |
| 5,825,470 | 10/1998 | Miyai et al. | 355/72 |

FOREIGN PATENT DOCUMENTS 0 297 506   1/1989   European Pat. Off. .

OTHER PUBLICATIONS

Zapka et al., "Laser Cleaning of Wafer Surfaces and Lithography Masks," *Microelectronic Engineering* 13:547–550 (1991). ( No Month Available).

*Primary Examiner*—Josie Ballato
*Assistant Examiner*—Minh Tang
*Attorney, Agent, or Firm*—Klarquist Sparkman Campbell Leigh & Whinston, LLP

[57] ABSTRACT

Charged-particle-beam (CPB) projection-exposure apparatus are disclosed for inspecting a reticle and/or a substrate without having to remove the reticle and/or substrate from a vacuum chamber in which projection-exposure occurs. The CPB projection-exposure apparatus comprises a microscope for inspecting the reticle or substrate inside the vacuum chamber. For inspection, the reticle or mask is moved from a projection-exposure position to an inspection position within a field of view of the microscope without having to open the vacuum chamber.

13 Claims, 1 Drawing Sheet

CHARGED-PARTICLE-BEAM PROJECTION-EXPOSURE APPARATUS WITH INTEGRATED RETICLE AND SUBSTRATE INSPECTION

FIELD OF THE INVENTION

The present invention relates generally to charged-particle-beam (CPB) projection apparatus and methods for projecting a pattern, defined on a reticle (mask), onto a sensitive substrate using a charged-particle beam such as an electron beam or an ion beam.

BACKGROUND OF THE INVENTION

In conventional optical projection-exposure apparatus for microlithography, the reticle (mask) or substrate typically must be removed from the apparatus in order to ascertain and detect whether or not any contaminant particles are present on the reticle or substrate and, if so, to remove the contaminant particles from the reticle or substrate. After removing the contaminant particles, the reticle is conventionally covered with a protective film such as a film of periclase (MgO) and used while so covered.

With conventional apparatus used for charged-particle-beam (CPB) lithography, such as electron-beam lithography, it is not practical to cover the reticle with a protective film because the charged particles in the beam generally experience difficulty in penetrating the film. Consequently, with such conventional apparatus, the reticle must either be used without cleaning or, if previously cleaned, with any new particles that have become attached to the reticle since the last cleaning.

Since CPB lithography is performed in a vacuum chamber, having to remove the reticle or substrate for inspection and/or cleaning is cumbersome. Also, removing the reticle or substrate from the vacuum chamber increases the likelihood of further contamination of the reticle or substrate.

Unfortunately, images of contaminant particles attached to a reticle can be projected onto the substrate. During such projection, the projected image of the contaminant particles can be magnified with decreases in the desired feature size of the projected pattern. Since a reticle used in a CPB lithography typically cannot be covered with a protective film, contaminant particles present in the CPB lithography apparatus can become attached to an originally clean reticle after the reticle is installed in the electron beam projection apparatus.

Also, as the feature sizes defined by the reticle are made progressively smaller, it becomes increasingly difficult to inspect and remove contaminant particles attached to the reticle.

SUMMARY OF THE INVENTION

In view of the foregoing, an object of the present invention to provide a CPB projection apparatus in which a reticle and/or substrate can be inserted, inspected, and possibly cleaned as necessary before use without having to remove the reticle and/or substrate from the CPB projection apparatus.

According to one aspect of the invention, a CPB projection-exposure apparatus is provided that projects a pattern, defined by the reticle, onto a sensitive substrate by illuminating the reticle using the charged-particle beam. The apparatus comprises a vacuum chamber enclosing the projection-exposure apparatus. The apparatus also comprises an inspection microscope or analogous appliance inside the vacuum chamber for inspecting the reticle and/or substrate, and a first shifting mechanism inside the vacuum chamber that moves the reticle or substrate to the inspection microscope for inspection purposes. Thus, the reticle and/or substrate can be inspected, and then placed in position for projection exposure, and vice versa, without having to remove the reticle or substrate from the vacuum chamber.

The microscope can be an optical microscope, wherein the first shifting mechanism moves the reticle or substrate into the field of view of the microscope for inspection. Alternatively, the microscope can employ a charged particle beam for inspection purposes.

The apparatus can also comprise a cleansing compartment located inside the vacuum chamber, and a second shifting mechanism used for moving the reticle and/or substrate between the cleansing compartment and the projection-exposure position. Inside the cleansing compartment, the reticle or substrate is cleaned. Before or after cleaning, the reticle or substrate can be moved to the microscope for inspection. In any event, movement of the reticle or substrate to and from the cleansing compartment is performed without having to remove the reticle or substrate from the vacuum chamber. Preferably, the cleansing compartment is separated using a gate valve or the like from a region of the vacuum chamber in which projection-exposure occurs, wherein the reticle or substrate is passed through the gate valve.

According to another aspect of the invention, data from one or more detection microscopes is provided to a processor for analysis of the degree of contamination or physical flaw of the reticle or substrate.

The foregoing and additional features and advantages of the invention will be more readily apparent from the following detailed description, which proceeds with reference to the accompanying drawings.

DETAILED DESCRIPTION

Figure 1:
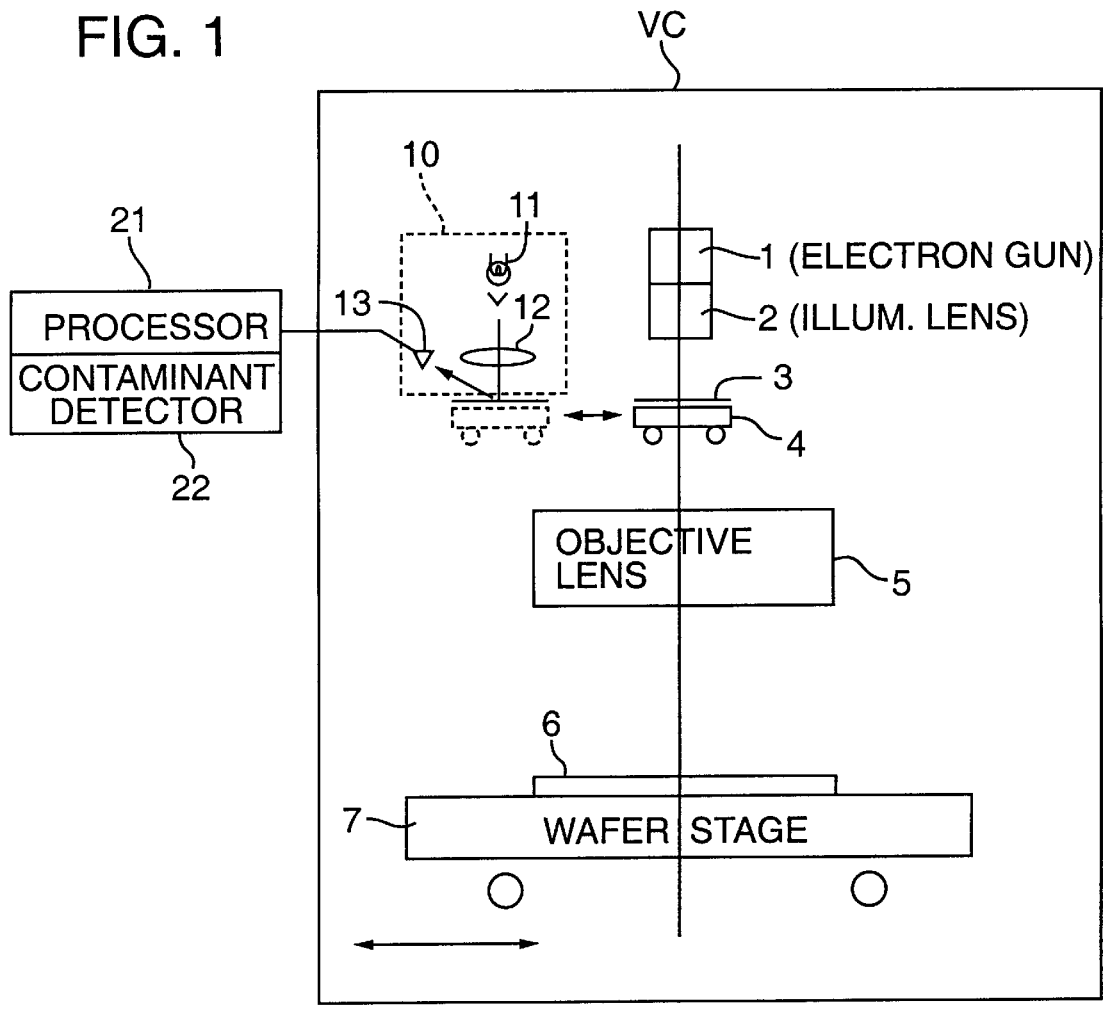
FIG. 1 is a schematic elevational depiction of a preferred embodiment of a CPB projection-exposure apparatus, according to the present invention, having reticle-inspection capability within the vacuum chamber in which projection-exposure occurs.

A preferred embodiment of a CPB projection apparatus, according to the present invention, having reticle-inspection capability in addition to projection-exposure capability, is shown in FIG. 1. The FIG. 1 apparatus is particularly suitable for electron-beam lithography; however, it will be understood that the principles described below with respect to such an apparatus are equally applicable to a CPB apparatus, according to the invention, employing a charged-particle beam other than an electron beam.

The apparatus of FIG. 1 comprises an electron gun 1 that emits an electron beam. Electrons from the electron gun 1 pass through an illumination electromagnetic lens 2 to illuminate a reticle (mask) 3. The reticle defines a pattern to be projection-exposed onto a sensitive substrate. The reticle 3 is held in a reticle stage 4 operable to move the reticle as required for exposure (the reticle is typically not exposed entirely at the same time but rather is divided into subfields each defining a respective portion of the overall pattern). Electrons passing through the reticle 3 pass through an electromagnetic objective lens 5 to expose a corresponding region on a sensitive substrate (wafer) 6. The substrate 6 is held in a wafer stage 7 operable to move the substrate as required for exposure.

The FIG. 1 embodiment also comprises a microscope 10 or analogous appliance used for inspecting the reticle 3 for contaminant particles (e.g., metal particles). The microscope 10 is preferably an optical microscope comprising an illuminator 11, an objective lens 12 for directing illuminant light emitted by the illuminator 11 onto an inspection field on the reticle 3, and a detector 13 for detecting a characteristic of light reflectively scattered by the inspection field of the reticle 3. A suitable optical microscope and detector (with controlling processor) is Model RT-8000 manufactured by Orbot Inc., Woburn, Mass. This instrument detects contaminant particles by changes in scattered light; the processor determines from such changes the positions and sizes of the contaminant particles on the reticle.

The contaminant-detection microscope 10 and the electron gun 1 are preferably situated in a vacuum chamber VC. Such an arrangement allows the reticle 3 to be moved between a first position for projection-exposure (midway between the illumination lens 2 and the objective lens 5, the first position being indicated by solid lines) and a second position for inspection of the reticle 3 (a position at which illuminant light from the illuminator 11 converges, the second position being indicated by broken lines) without having to remove the reticle from the vacuum chamber.

The reticle is inspected for contaminant particles preferably in the following manner using the FIG. 1 embodiment. First, the reticle 3 is laterally shifted to the contaminant-inspection microscope 10 by motion of the reticle stage 4. Second, the inspection field on the reticle 3 is scanned using the microscope 10. The reticle 3 can be scanned continuously and/or stepwise by appropriate movement of the reticle. Third, light scattered by the reticle 3 is detected by the detector 13 which generates a detection signal conducted through the vacuum chamber VC to a processor 21. The processor 21 compares the detected signal with a separate signal corresponding to a respective uncontaminated region of the reticle 3. The separate signals are conducted from the processor 21 to a contaminant detector 22 which analyzes the compared signals for evidence of the presence of contaminant particles on the reticle 3. This method of contaminant detection is highly sensitive.

With the FIG. 1 embodiment, the reticle 3 can be inspected for contaminants without exposing the reticle to the atmosphere since the contaminant-detection microscope 10 is located inside the same vacuum chamber VC as the electron optics used for projection exposure. Thus, it is possible to inspect the reticle 3 for contaminants after contaminant particles become attached to the reticle during use of the reticle for projection exposure by the electron beam, without having to remove the reticle from the vacuum-chamber environment. Also, the reticle is thus not contaminated during the act of removing the reticle from the projection-exposure apparatus for inspection.

The data (including contamination-detection signals) produced by the detector 13 are processed by the processor 21 and the contaminant detector 22. In embodiments comprising multiple (N, wherein N is an integer $\geq 2$) projection-exposure apparatus that can be used simultaneously, the processor can be sufficiently large to process data supplied by multiple contaminant detectors $13_1, \ldots, 13_N$, where $13_k$ represents the contaminant detector installed in the kth projection-exposure apparatus ($1 \leq k \leq N$), if necessary. Since a large amount of computation is normally required to determine the presence of contaminant particles on a reticle on which a fine (micro) pattern is formed, the data supplied from the N contaminant detectors $13_1, \ldots, 13_N$ can be more effectively processed by centralizing the data-processing system using one large-scale computer as a central data processor than by using multiple simpler processors $21_1, \ldots, 21_N$, where $21_k$ denotes the processor pertaining to the kth projection-exposure apparatus.

The FIG. 1 embodiment can further comprise a cleansing compartment used for cleansing the reticle 3 (or substrate, as described later). The cleansing compartment is preferably located inside the vacuum chamber VC. For example, when contaminant particles are detected by the contaminant-detection microscope 10 on the reticle 3, the reticle can be moved to the cleansing compartment to cleanse the reticle. After being cleansed, the reticle 3 can be protected against deposition of any new contaminant particles by moving the reticle from the cleansing compartment to the projection-exposure apparatus without opening the vacuum chamber VC. Such motion of the reticle 3 can be performed by moving the reticle stage 4.

The reticle 3 (and/or substrate) can be cleansed, for example, by illuminating the contaminated region of the reticle using an excimer laser or pulsed laser such as a $CO_2$ laser, and/or by any of various dry-cleansing methods such as cleansing with ozone. When cleansing the reticle 3, the entire reticle can be cleansed; alternatively, only those regions of the reticle 3 on which contaminants have been detected by the detector 13 can be cleansed.

Preferably, a gate valve (functioning as a shutter that can be selectively opened and closed) is located between the cleansing compartment and adjacent compartments of the vacuum chamber VC. A gate valve is effective for confining contaminant particles inside particular compartments (such as the cleansing compartment), thus preventing dispersion of the contaminant particles throughout the vacuum chamber. A gate valve also allows the conditions inside the cleansing compartment to be controlled independently of adjacent compartments in the vacuum chamber VC.

Figure 2:
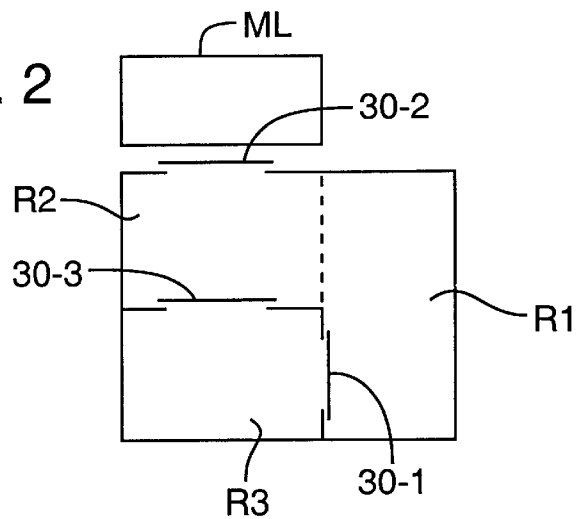
FIG. 2 is a schematic depiction of certain features of a CPB projection-exposure apparatus, according to the invention, including a cleansing compartment in the vacuum chamber.

FIG. 2 depicts a representative embodiment of a vacuum chamber VC (such as that of FIG. 1) partitioned into an inspection compartment R2, a projection-exposure compartment R1, and a cleansing compartment R3. The compartments R1, R2, R3 are separated from each other by partitioning walls. A separate gate valve 30-1, 30-2, 30-3 is located on each respective partitioning wall. Thus, the reticle 3 (or substrate) can be moved among the three compartments. I.e., the gate valve 30-2 permits movement of the reticle from a mask-loading compartment ML to the inspection compartment R2; the gate valve 30-3 permits movement of the reticle from the inspection compartment R2 to the cleansing compartment R3; and the gate valve 30-1 permits movement of the reticle from the cleansing compartment R3 to the projection-exposure compartment R1. The reticle can be moved from the projection-exposure compartment R1 to the inspection compartment R2 without having to pass through a gate valve.

In a typical operational sequence, the reticle 3 is transported from the mask-loader ML to the inspection compartment R2 where the reticle is inspected for contaminants. If no contaminant particles are detected on the reticle, the reticle is transported directly to the projection-exposure compartment R1. If contaminant particles are detected on the reticle 3, the reticle is transported to the cleansing compartment R3 for cleaning. After the reticle is cleansed, it is moved to the inspection compartment R2 for re-examination to ensure that no contaminant particles remain on the reticle after cleaning. The reticle is re-cleansed as required until the reticle is free of particulate contaminants, at which time the reticle 3 is moved to the projection-exposure compartment R1 for use in exposing a pattern defined by the reticle onto the substrate.

The gate valves 30-1, 30-2, 30-3 are normally closed, and an appropriate gate valve is opened for movement of the reticle therethrough from one compartment to another. For example, the gate valve 30-3 remains closed whenever the reticle 3 is being cleansed in the cleansing compartment R3. This allows the reticle to be cleansed in a desired atmosphere.

The embodiments described above are not limited to use for reticle inspection and cleaning. These embodiments can also be used for inspection and cleaning, as necessary, of the substrate 6 (e.g., a wafer) or the like. For example, the substrate 6 can be shifted to a position appropriate for inspection by moving the wafer stage 7. If desired, a substrate-cleansing compartment (separate from the reticle-cleansing compartment and accessed by a respective gate valve) can be included inside the vacuum chamber VC for the purpose of cleansing the substrate; after cleansing, the substrate can be moved as required inside the vacuum chamber for inspection or projection-exposure without exposing the substrate to the atmosphere.

As indicated above, the contaminant-detection microscope 10 can be an optical microscope. Alternatively, as required, any of various other microscopes can be employed, such as an electron microscope or scanning electron microscope. (An example of an electron-beam inspection instrument, including electron-optical system, detector, and controlling processor, that can be used is the SEMSPEC instrument manufactured by KLA Instruments Corp, San Jose, Calif.) Advantages of using an optical microscope are: (1) contaminant particles can be detected at high speed using a detector 13 having a high detection-signal-to-noise ratio, and (2) contaminants can be detected in a gaseous environment since a vacuum is not required for operation of the optical microscope. However, an electron microscope is advantageous because contaminant particles can be detected with high accuracy and clearly at high magnification.

In addition to detecting contaminant particles on reticles and substrates, methods and apparatus according to the invention as described above can also be used for detecting the presence of flaws and/or other physical defects on the reticle 3 and/or the substrate 6.

In the foregoing description, the reticle stage 4 and the wafer stage 7 as used for moving the reticle and substrate, respectively, from a position for projection exposure to a position for inspection, and back again, can be regarded as a first shifting mechanism. These stages as used for moving the reticle or substrate from, e.g., the projection-exposure compartment to the cleansing compartment or the cleansing compartment to the inspection compartment can be regarded as a second shifting mechanism.

Methods and apparatus of the present invention allow a reticle and/or substrate to be inspected and/or cleansed without opening the vacuum chamber in which the reticle and/or substrate will be used for projection-exposure. The first shifting mechanism moves the reticle and/or substrate from the projection-exposure compartment to the inspection compartment and to within the field of view of the contaminant-detection microscope for inspection. By including a cleansing compartment inside the same vacuum chamber in which projection-exposure occurs, contaminant particles attached to the reticle and/or substrate can be removed without exposing the reticle and/or substrate to the atmosphere.

During inspection of the reticle and/or substrate, detection signals produced by multiple contaminant-detection microscopes contained in the vacuum chamber can be efficiently processed using a central data processor.

Whereas the invention has been described in connection with a preferred embodiment, it will be apparent that the invention is not limited to that embodiment. On the contrary, the invention is intended to encompass all modifications, alternatives, and equivalents as may be included within the spirit and scope of the invention as defined by the appended claims.

What is claimed is:

1. A charged-particle-beam projection-exposure apparatus for exposing a pattern defined by a reticle onto a sensitive substrate, the apparatus comprising:

(a) a vacuum chamber;

(b) a charged-particle-beam source located inside the vacuum chamber and charged-particle-beam optics for directing the charged particle beam in a manner suitable for performing projection exposure;

(c) a respective projection-exposure position located inside the vacuum chamber for the reticle and the substrate, in which projection-exposure positions the reticle and substrate, respectively, are placed for performing projection exposure of the reticle pattern onto the substrate;

(d) an inspection apparatus for performing an inspection, inside the vacuum chamber, of the reticle placed at an inspection position inside the vacuum chamber so as to ascertain whether or not the reticle has a physical flaw or particulate contamination sufficient to adversely affect the projection exposure; and (e) a first shifting mechanism for moving the reticle inside the vacuum chamber between the inspection position and the respective projection-exposure position without opening the vacuum chamber.

2. The apparatus of claim 1, wherein the first shifting mechanism comprises a reticle stage for moving the reticle inside the vacuum chamber between the inspection position and the respective projection-exposure position without opening the vacuum chamber.

3. The apparatus of claim 1, wherein the inspection apparatus is operable to selectively perform an inspection of the reticle.

4. The apparatus of claim 3, wherein the first shifting mechanism comprises a reticle stage for moving the reticle inside the vacuum chamber between the inspection position and the reticle projection-exposure position inside the vacuum chamber.

5. The apparatus of claim 1, wherein the inspection apparatus is a microscope.

6. The apparatus of claim 5, wherein the microscope is an optical microscope.

7. The apparatus of claim 5, wherein the microscope is an electron microscope.

8. The apparatus of claim 5, wherein the microscope is operable to inspect the reticle by illuminating a charged particle beam onto the reticle.

9. The apparatus of claim 1, further comprising:
- a cleansing compartment inside the vacuum chamber in which cleansing compartment the reticle is cleaned; and
- a second shifting mechanism for moving the reticle between the cleansing compartment and the respective projection-exposure position without opening the vacuum chamber.

10. The apparatus of claim 9, further comprising a gate valve allowing passage of the reticle into the cleansing compartment for cleaning and out of the cleansing compartment for inspection or use in projection exposure.

11. The apparatus of claim 1, wherein the inspection apparatus comprises a detector for detecting a physical flaw or particulate contamination on the reticle.

12. The apparatus of claim 11, further comprising a processor to which the detector is connected, the processor obtaining electrical signals from the detector pertaining to a condition of the reticle as detected by the detector, and performing a calculation using data in the signals sufficient to ascertain whether or not the inspected reticle has a physical flaw or particulate contamination.

13. An inspection system, comprising:
- (a) multiple charged-particle-beam projection-exposure apparatus each as recited in claim 1; and
- (b) a data processor for processing detection signals supplied from each of the inspection apparatus of each of the charged-particle-beam projection-exposure apparatus.

* * * * *